United States Patent [19]

O'Malley

[11] Patent Number: 5,741,141
[45] Date of Patent: Apr. 21, 1998

[54] NON-DESTRUCTIVE INTERCONNECT SYSTEM FOR SEMICONDUCTOR DEVICES AND A CARRIER ASSEMBLY FOR USE THEREWITH

[75] Inventor: Austin S. O'Malley, Rehoboth, Mass.

[73] Assignee: Texas Instruments Incorporated, Dallas, Tex.

[21] Appl. No.: 717,030

[22] Filed: Sep. 20, 1996

Related U.S. Application Data

[60] Provisional application No. 60/008,428, Dec. 11, 1995.
[51] Int. Cl.⁶ ............................................ H01R 9/09
[52] U.S. Cl. .................................... 439/73; 439/331
[58] Field of Search ............................ 439/331, 330, 439/73, 71, 264, 526, 266, 267

[56] References Cited

U.S. PATENT DOCUMENTS

| | | | |
|---|---|---|---|
| 5,127,837 | 7/1992 | Shah et al. | 439/71 |
| 5,397,245 | 3/1995 | Roebuck et al. | 439/264 |
| 5,468,157 | 11/1995 | Roebuck et al. | 439/264 |
| 5,468,158 | 11/1995 | Roebuck et al. | 439/264 |

*Primary Examiner*—Gary F. Paumen
*Assistant Examiner*—Tho D. Ta
*Attorney, Agent, or Firm*—Russell E. Baumann; Richard L. Donaldson; Reneé E. Grossman

[57] ABSTRACT

An interconnect system for providing electrical connection to bond pads of a semiconductor device (14) includes a socket (18) having a plurality of conductors (16) and a carrier assembly (10) receivable in the socket (18) carrying a semiconductor device (14). The carrier assembly comprises a substrate assembly (12) and a latch assembly (22, 122, 222). The substrate assembly (12) includes a substrate (12a) having a complaint membrane (12f) and a plurality of contact bumps (12i) on a top surface of the complaint membrane (12c) for contacting bond pads on the semiconductor device (14). The force applying latch assembly (22, 122, 222) applies pressure in making a temporary electrical connection between contact bumps (12i) and the bond pads of semiconductor device (14). Latch assembly (222) comprises a latch (232) which cooperates with a spring (231) to place a force on a lid (224, 324, 424) which in turn places a force on the semiconductor device (14). An ejector member (250, 350) is mounted on the lid to apply a force on the semiconductor device to separate the semiconductor from the lid upon removal of the lid from the carrier assembly (10).

8 Claims, 5 Drawing Sheets

NON-DESTRUCTIVE INTERCONNECT SYSTEM FOR SEMICONDUCTOR DEVICES AND A CARRIER ASSEMBLY FOR USE THEREWITH

FIELD OF THE INVENTION

This application claims priority under 35 USC § 119(c)(1) of provisional application number 60/008,428 filed Dec. 11, 1995.

This invention relates to semiconductor devices and, more particularly, to a non-destructive interconnect system for semiconductor devices and to a carrier assembly comprising substrate and latch assemblies for use in such a system.

BACKGROUND OF THE INVENTION

The semiconductor industry is entering a new phase of packaging density with the development of electronic modules containing multiple integrated circuit (IC) die. Recent increases in semiconductor clock speeds, the number of inputs and outputs, die densities and pad densities have made it desirable to package a variety of different integrated circuits, such as microprocessors, ASIC devices and memory devices, together into multi-chip modules (MCM) and hybrids to create high performance products.

A factor identified in the industry as critical to the successful development of multi-chip modules is the availability of "known good die" (KGD). A known good die is a die in which there is a very high confidence level that it will operate reliably over its intended lifetime. With many die mounted into a multi-chip module, the compound effect of the individual yields of the different die becomes an issue. For example, twenty die assembled into a multi-chip module (MCM) having individual yields of 95% will produce an MCM first past test yield of 35%. Such a low yield will result in an undesirable quantity of material scrap and require very expensive and labor intensive rework. The use of known good die is required to achieve optimal first pass test yields in producing multi-chip modules in either a chips first or chips last assembly approach.

Since semiconductor die exhibit early life failures when tested across time, "burn-in" testing at elevated temperatures, is used to identify potentially defective die which are separated from the remaining known good die. The potentially defective die are discarded and only the remaining known good die are placed in their final packaging configuration.

In coassigned U.S. Pat. No. 5,397,245 a die level burn-in test interconnect system is disclosed and claimed for use in conventional burn-in ovens and is non-destructive in that it allows semiconductor die to be thoroughly tested and conditioned without damaging the bonding pads or surface passivation of the die. The system includes a burn-in test board, a socket for mounting on the burn-in test board and a die carrier assembly for insertion into the socket which serves as a temporary package for a semiconductor die.

The burn-in test board is connected to burn-in test equipment used to test semiconductor die with the sockets mounted on the test boards adapted to receive and securely hold a die carrier assembly containing a die to be tested. The socket includes a plurality of conductors movable between an open or retracted position in which a die carrier assembly can be placed in the socket and a closed position in which the conductors are in contact with pads on a substrate of the die carrier assembly securely holding the assembly in the socket. The die carrier assembly includes a substrate assembly on which a die to be tested is placed with bond pads on the die aligned and engaged with contact bumps formed on the substrate assembly and which distributes signals from the die under test to test equipment via the conductors in the socket to the burn-in test board. The die carrier assembly includes a latch assembly or force applying mechanism for securing a die to the substrate assembly and for applying a selected force to the die. The latch assembly comprises a pair of posts extending upwardly from the substrate assembly and a lid received between the posts and disposed over the die. In one embodiment a spring is biased against the lid through a screw mounted on a plate which reacts against the heads of the posts. In another embodiment a rotary latch comprises a pair of ramps having openings through which the heads of the posts are inserted and the latch is rotated so that the heads move up the ramp to a detent to lock the mechanism with a spring force placed from the lid to the die.

The above described latch mechanisms are effective for placing a selected force on the die to ensure effective electrical connection between the die pads and the contact bumps on the substrate assembly. However, a problem occurs when used in high speed automated processing. An automated approach for producing fully tested and burned-in "known good die" in large volumes must be fast and efficient. The die is placed on a carrier typically with automatic loading equipment. As described above, appropriate pressure is applied to the die through a lid assembly to reliably connect the die bond pads with the substrate bumps on the carrier. After the final test the die must be quickly and automatically removed from the carrier.

During lid removable, after testing has been completed, it is not uncommon for the tested die to adhere to the lid for a short period of time, e.g., milliseconds, causing damage to the die or moving it out of position on the carrier interfering with robotic retrieval. This temporary adhesion is due, for example, to being subjected to high temperature for extended periods of time or small amounts of contaminants between the lid and die.

It is, therefore, an object of the invention to provide a latch assembly for use with non-destructive interconnect systems for semiconductor devices in which a semiconductor device can be latched into a carrier system with a selected force applied to the semiconductor device and which can then be released from the carrier without any momentary sticking or adhesion tendency.

SUMMARY OF THE INVENTION

Briefly, in accordance with the invention, a carrier assembly for carrying a semiconductor device comprises a base, a substrate on the base having a plurality of contact bumps on a top surface for contacting bond pads on the semiconductor device, and a pair of posts extending from the base having head portions. The posts are received in respective openings of a lid having a force applying surface to apply a force to the semiconductor device. A latch having a pair of openings with a first portion larger than the post heads and a second portion smaller than the post heads, is disposed over the lid with the post heads received through the first portion of the respective openings and movable over the second portion to lock the latch to the base. The lid is provided with a bore having a first threaded portion which receives a threaded member extending through an opening in the latch. A second portion of the bore in the lid extends through the lid with an ejector member movably mounted in the second portion of the bore and being spring biased to extend out of the lid beyond the force applying surface. According to a first embodiment the ejector member is spherical in configuration and the diameter of the bore in the lid at the force applying surface is reduced to serve as a retainer allowing the ejector member to project beyond the force applying surface a selected distance. According to a modified embodiment, the second portion of the bore is chamfered at the force applying side of the lid and the ejector member is a spring biased piston mounted in the bore. The piston has a radially extending flange which serves as a retainer to limit outward movement of the piston through the bore. According to another modified embodiment, useful when simultaneously testing a plurality of die, two or more bores aligned with respective seats of a like number of die are formed in the lid with a reduced diameter portion at the force applying surface and with an ejector member spring biased in each bore. The spring force placed on the ejector member of the above embodiments is less than the primary force applied to the semiconductor device so that the ejector member is forced into the bore when the latch mechanism is in the latched condition. Upon unlatching, however, the ejector member is biased out beyond the force applying surface of the lid to separate the semiconductor device from lid.

The invention accordingly comprises the constructions hereinafter described, the scope of the invention being indicated in the appended claims.

BRIEF DESCRIPTION OF THE DRAWINGS

In the accompanying drawings, in which several of various possible embodiments of the invention are illustrated.

Corresponding reference characters indicate corresponding parts throughout the several views of the drawings.

DETAILED DESCRIPTION OF THE PREFERRED EMBODIMENTS

Figure 1:
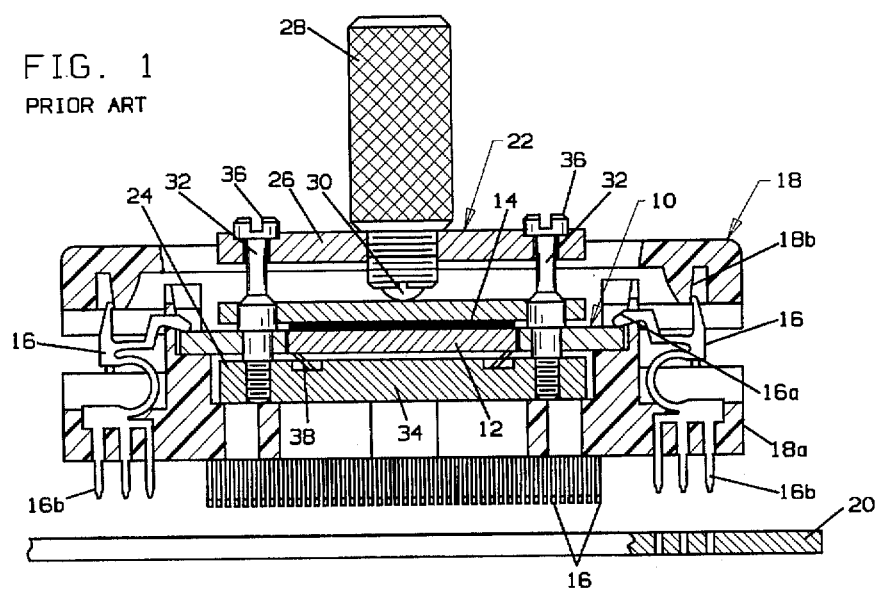
FIG. 1 is a cross sectional view of a test interconnect system as shown U.S. Pat. No. 5,397,245 referenced above.

Turning now to FIG. 1, a semiconductor die carrier assembly 10 as seen in U.S. Pat. No. 5,397,245 comprises a substrate assembly 12 on which a die 14 to be tested is placed and which distributes signals from die 14 under test to test equipment via conductors 16 in socket 18 and conductive traces (not shown) in burn-in test board 20. A latch assembly or force applying mechanism 22 includes a lid 24, latch 26, pressure screw 28 and a spring bias tip 30. Post members 32 extending from back plate or base 34 are provided with heads 36 which cooperate with pressure screw 28 to apply a selected force on die 14 through lid 24 That is, latch plate 26 reacts against heads 36 so that a force from spring biased tip 30 is applied to lid 24.

Figure 2:
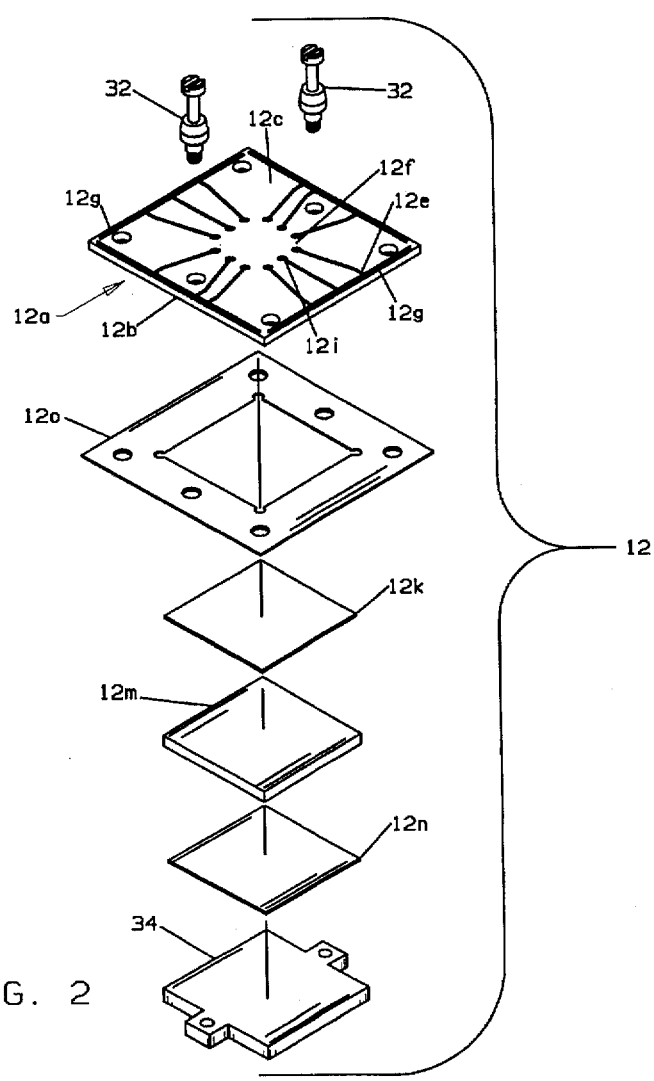
FIG. 2 is an exploded perspective view of a substrate assembly useful in the FIG. 1 system as well as in the system made in accordance with the invention.

With particular reference to FIG. 2, substrate assembly 12 includes a substrate 12a having a base 12b of metal, for example, with a thin film interconnect 12c formed over the top surface of base 12b. Thin film interconnect 12c may, for example, include a single layer of a polymer dielectric film such as polyamide, on which conductive signal traces 12e are formed. An opening (not shown) is etched through 12b to produce a complaint membrane 12f in a portion of thin film interconnect 12c.

Substrate 12a also includes a plurality of conductive pads 12g formed on the top surface of thin film interconnect 12c and electrically connected to associated signal traces 12e. Pads 12g are formed around the periphery of thin film interconnect 12c so that each pad 12g contacts one of the contact portions 16a of a conductor 16 when die carrier assembly 12 is inserted into socket 18, as hereinafter described.

Substrate 12a also includes a plurality of conductive bumps 12i formed of gold or copper, for example, on the top surface of thin film interconnect 12c and electrically connected to associated signal traces 12e for probing or contacting the bond pads of die 14. Bumps 12i are arranged in a pattern so as to contact associated bond pads on the bottom of die 14. Substrate assembly 12 also includes back plate or base 34, support member 12k, compressible insert 12m, rigid support 12n and back plate spacer 12o. An annular spring 38, as shown in FIG. 1, may be disposed between back plate 34 and rigid support 12n to supply pressure to shim elements 12k, 12m, 12n which fit into the opening in base 12b.

As seen in FIG. 1, the carrier assembly 10 and latch assembly 22 are received in a socket 18 which has a cover 18b movable from a first position shown in the figure to a second position toward base 18a of the socket. As cover 18b moves toward the base 18a, conductors 16 are cammed so that the conductor tips 16a move upwardly and outwardly (not shown) and as the cover is allowed to return to the first, at rest, position conductor tips 16a move downwardly and inwardly into engagement with respective pads 12g on a substrate assembly 12 received in socket 18. Terminal leads 16b are received in through holes of burn-in test board 20 and attached to traces (not shown) thereon in a conventional manner.

Conventional vision positioning equipment (not shown) typically place and align the die 14 on substrate 12 of die carrier assembly 10 using known optical recognition techniques. Lid 24, latch 22 and pressure screw 28 cooperate to apply pressure to and securely hold die 14 during testing.

Figure 3:
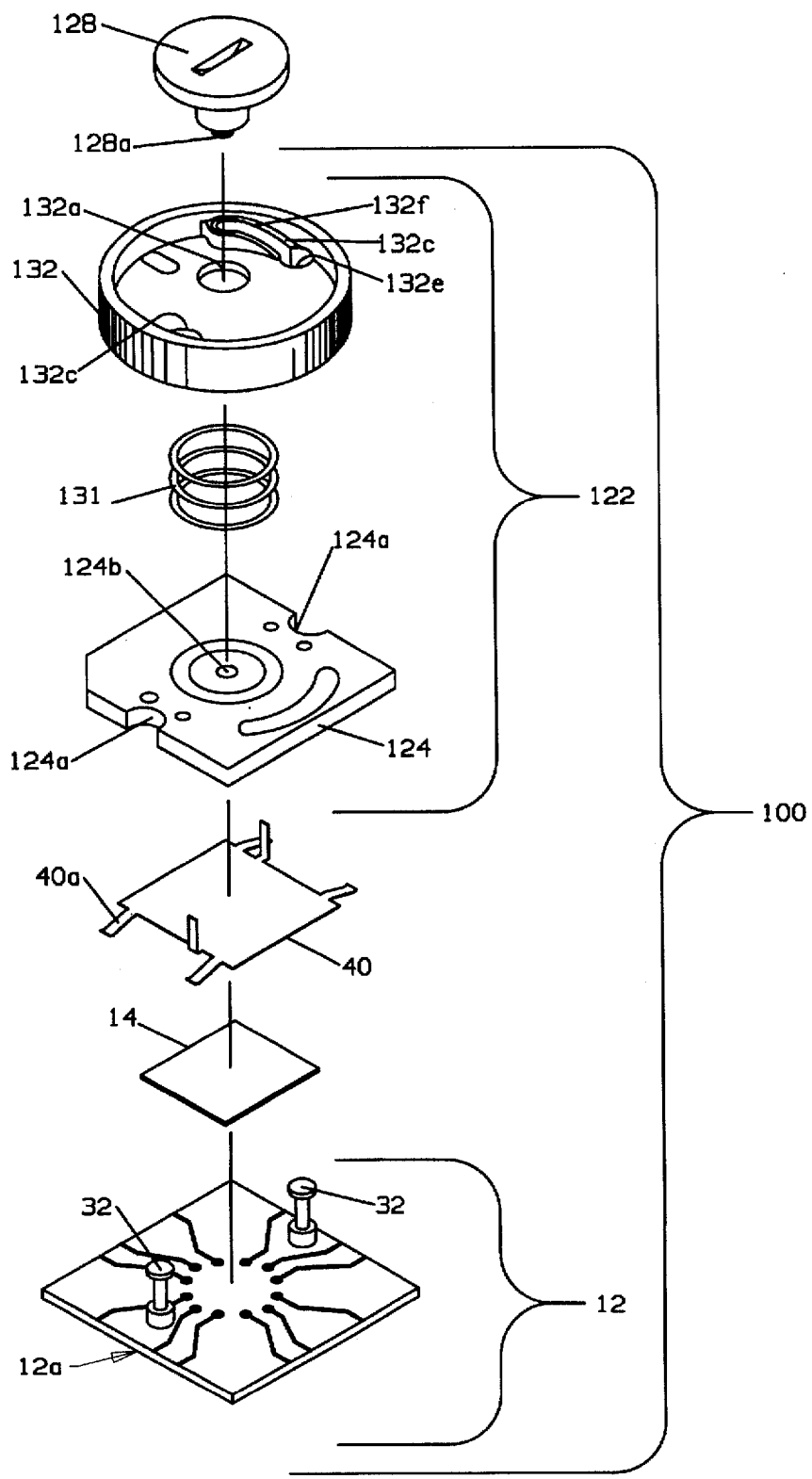
FIG. 3 is an exploded perspective view of a semiconductor carrier assembly useful in the FIG. 1 interconnect system.

FIG. 3 shows an exploded perspective view of carrier assembly 100 having an alternative latch assembly 122 which comprises a rotary latch 132, center post 128, spring 131 and lid 124. Latch assembly 122 provides automated or hand assembly capability. A pair of ramps 132c are integral with rotary latch 132 and provide a gradual increase in force applied through preloaded spring 131 to lid 124 and therefore to die 14. Ramps 132c have openings 132e through which heads of posts 32 are inserted and openings 132f which receive the shafts of posts 32 when latch 132 is rotated. Force is applied to lid 124 by rotating latch 132 so that the heads of posts 32 move up ramps 132c. Post cut-outs 124a in lid 124 receive posts 32 of substrate assembly 12 maintaining a desired angular orientation of lid 124. Threaded portion 128a of center post 128 extends through centrally located bore 132a of rotary latch 132 and screws into threaded opening 124b of lid 124.

For semiconductor die that require backside ground or power biasing, die carrier assembly 100 may be provided with a biasing clip 40. Biasing clip 40 is formed of a conductive material, such as aluminum, and is sandwiched between lid 124 and the backside of die 14. Biasing clip 40 has conductive tabs 40a that contact those signal traces 12e on thin film interconnect 12c that supply power or ground to provide backside ground or power biasing for semiconductor die 14.

Figure 4:
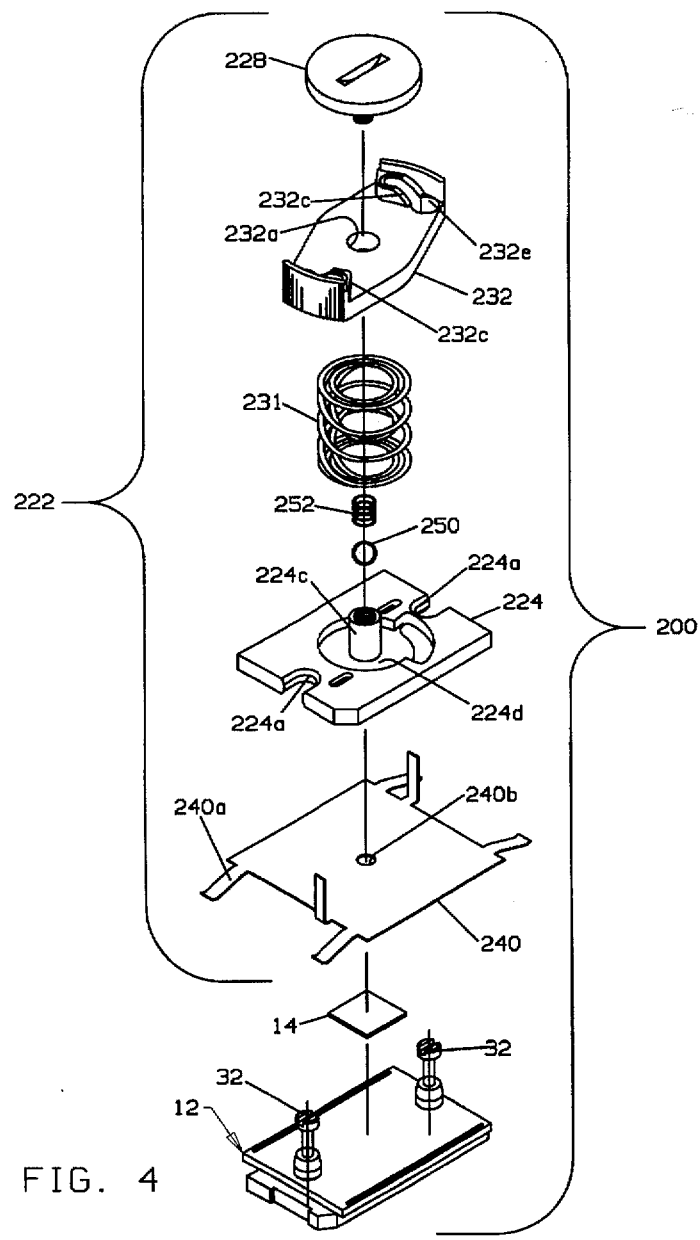
FIG. 4 is an exploded view of a semiconductor carrier assembly made in accordance with a first embodiment of the invention.
Figure 5:
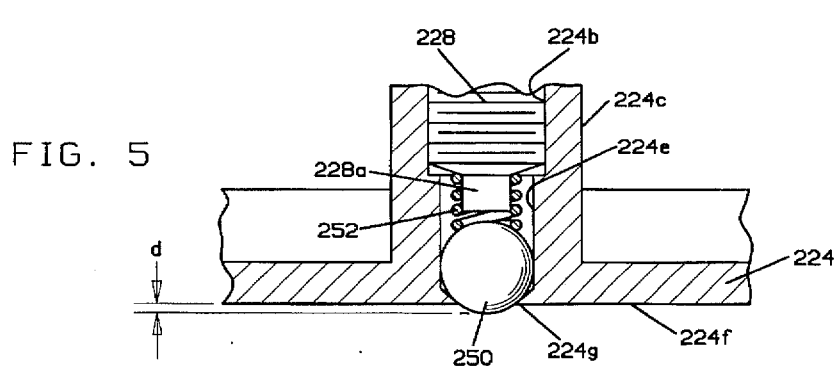
FIG. 5 is a cross sectional view taken through a portion of the lid of the FIG. 4 carrier showing an ejector member disposed therein.

As mentioned above, the above described force applying and latching mechanisms are effective in providing the desired electrical connection between the die and substrate assembly, however, upon completion of the test and upon removal of the force the die tends to adhere to the lid for a brief period of time, typically on the order of milliseconds, which interferes with automated processing equipment. With reference to FIGS. 4 and 5, a carrier assembly 200 and latch assembly 222 made in accordance with the invention is shown comprising a rotary latch 232, lid 224, spring 231, screw 228, ejector member 250 and ejector spring 252 in addition to substrate assembly 12 and optional biasing clip 240.

Lid 224 is similar to lid 124 of carrier 100 but is shown modified to include post portion 224c integral with the lid. Post 224c is provided with threaded bore 224b which receives screw 228. Rotary latch 232 is functionally the same as latch 132 but is shown with portions of latch 132 removed to form a generally elongated member extending between the two ramp portions 232c. The ramp portions have opening 232e through which posts 32 are inserted. It will be understood that the latch could have a circular configuration, if desired. Centrally located bore 232a receives post 224c with coil spring 231 disposed around post 224c in recessed seat portion 224d. Cut-out portions 224a, on opposed sides of lid 224, receive the base portions of posts 32 to maintain a selected angular orientation of lid 224. As seen in FIG. 5, bore 224b has a second portion 224e which extends through lid 224 to the bottom, force applying surface 224f. Bore 224e is formed with a reduced diameter opening 224g at surface 224f which serves as a retainer for ejector member 250 received in bore 224e. A coil spring 252 is disposed in bore 224e between ejector member 250 and screw 228. The distal end 228a of screw 228 is preferably turned down to form a seat for one end of spring 252 to maintain the spring in its centered position in engagement with ejector member 250 to place a constant force on member 250. The particular diameter of circular opening 224g is selected so that ejector member 250, a spherical ball of suitable material such as stainless steel, projects beyond surface 224f a selected distance d, such as 0.007 inch. Distances in the range of 0.004 to 0.009 inch have been found to suitable.

If a biasing clip is desired, aperture 240b is provided in clip 240 in alignment with aperture 224g when the clip is mounted on lid 224. Chip 224 has conductive tabs 240a similar to the tabs 40a described earlier.

In use, ejector member 250, when pressed against die 14, will retract into the lid 224 and maintain a force on the die adequate to prevent the die from sticking to the lid when the lid is quickly and automatically removed from the carrier assembly. A force on the order of 30–60 grams has been found to be effective. This compares to a primary force of approximately five pounds placed on lid 224 by spring 231.

Figure 6:
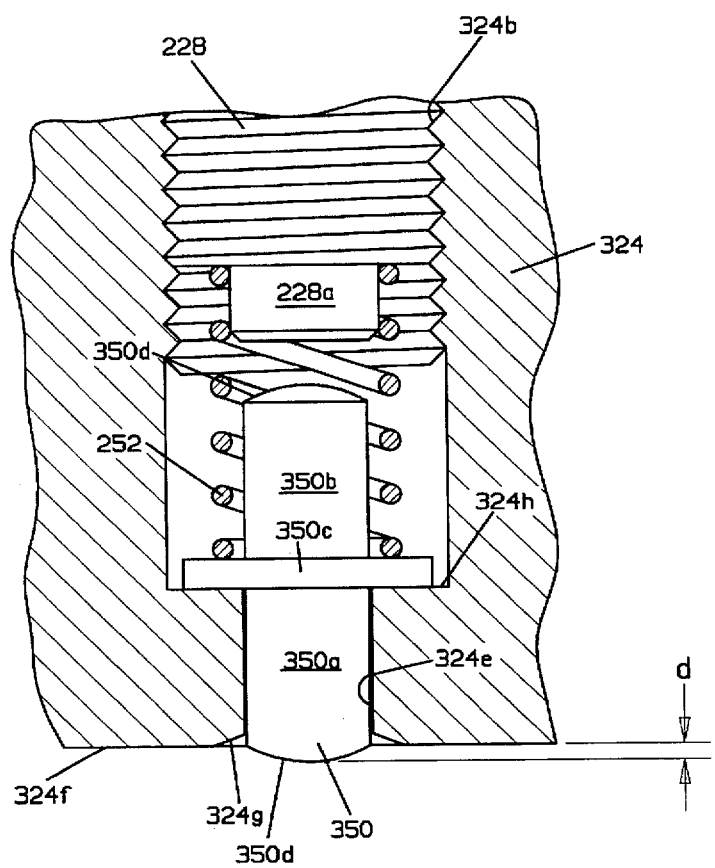
FIG. 6 is an enlarged cross sectional view taken through a portion of a lid showing an ejector member used in a second embodiment of the invention.

FIG. 6 shows an enlarged cross sectional view of a portion of a lid having an ejector mechanism according to a second embodiment of the invention. Lid 324 is formed with bore 324e which is formed with an enlarged chamfered portion 324g at the opening formed with force applying surface 324f of lid 324. Chamfered portion 324g facilitates forming an opening of bore 324b free of any burrs which could mark the die. Ejector member 350 is movably inserted in the bore and comprises first and second identical pin portions 350a, 350b extending from a flange 350c. Flange 350c serves as a retainer which cooperates with ledge 324h formed between bore portions 324b, 324e to limit the amount that pin portions 350a can extend out beyond surface 324f, shown as d in the figure. Coil spring 252 is disposed between reduced diameter portion 228a of screw 228 and pin portion 350b. In assembling the mechanism either end of ejector member 350 can be placed in bore portion 324e since both pin portions are identical. The outer end of each pin portion is provided with a smooth curved surface 350d for applying the ejection force to a die.

Figure 7:
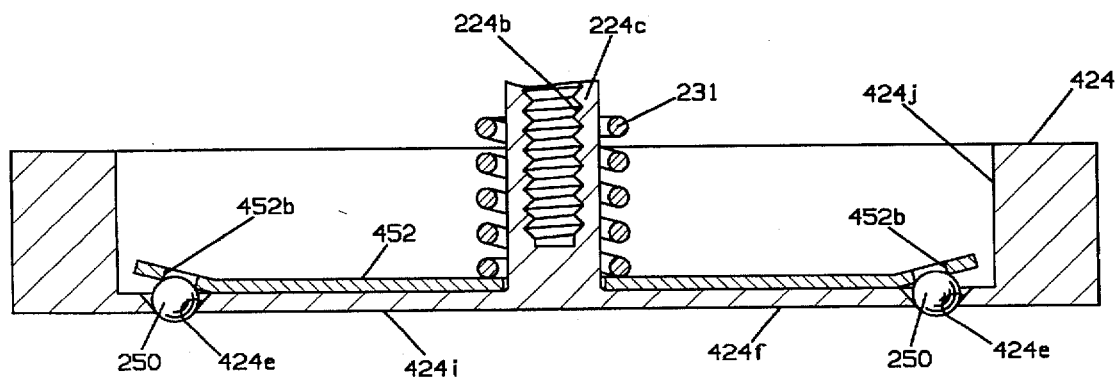
FIG. 7 is a cross sectional view taken through a portion of a lid made in accordance with a third embodiment of the invention.
Figure 8:
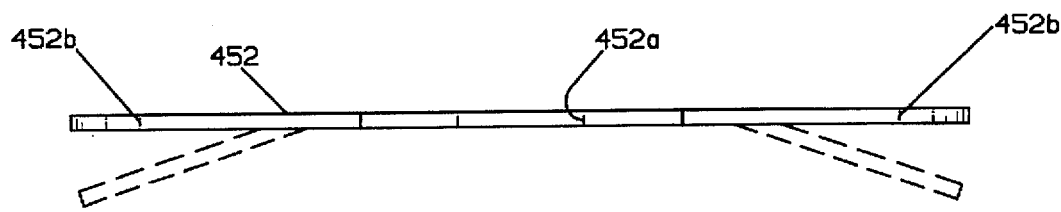
FIG. 8 is a front view of a spring member used in the FIG. 7 embodiment.
Figure 9:
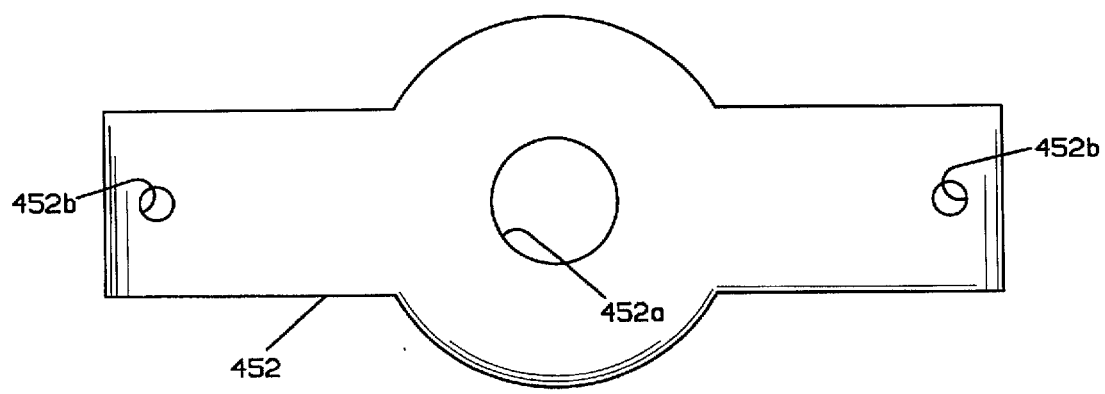
FIG. 9 is a top view of the FIG. 8 spring member.

FIGS. 7-9 show a third embodiment of the invention useful when a plurality of die are to be tested simultaneously. FIG. 7 is a cross sectional view taken through two ejector seats of lid 424. Chamfered bores 424e are formed through bottom wall 424i spaced from center post 224c in a slot 424j formed in lid 424. A spherical ejector member 250 of the same type used in the FIGS. 4 and 5 embodiment is placed in each chamfered bore 424e with a leaf spring 452 received over members 250. Leaf spring 452 has a centrally disposed aperture 452a which receives post 224c and preferably a small aperture 452b aligned with each bore 424e adapted to fit on top of a respective member 250 to maintain the member in the chamfered bore 424e. Coil spring 231 is disposed on top of leaf spring 452. Leaf spring 452 is pre-biased, as indicated by dashed lines of FIG. 8, to place a downward force on each ejector member. While only two ejector seats are shown in FIGS. 7-9 it will be understood that the particular number can be varied depending on the number of die to be tested with the ejector seats located to be in alignment with each die.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed:

1. A carrier assembly for carrying a semiconductor device comprising:

a substrate assembly including a substrate, a plurality of contact bumps on a top surface of the substrate for contacting bond pads on a semiconductor device, the substrate also including a plurality of conductive pads electrically connected to the contact bumps, a back plate having opposite side ends and a top surface and a bottom surface, means for contacting a top surface of the semiconductor device to force the bond pads of the semiconductor device against the contact bumps including, a pair of posts extending from the substrate, each of the posts having a shaft having a first diameter and a head having a second diameter greater than the first diameter, a lid having a pair of openings through which the posts extend, a latch having a pair of openings, each of the openings in the latch having a first portion larger than the head of an associated one of the posts and a second portion smaller than the head of an associated one of the posts, the lid having a bore extending through the lid to a lower, force applying surface, said bore having a reduced diameter portion, a first spring position between said lid and said latch, an ejector member having a spherical surface portion of a selected diameter larger than the reduced diameter portion of the bore received in the bore having at least a portion of the spherical portion movable beyond the bore on the force applying surface of the lid, and a second spring member placing a force on the ejector member in a direction to move the ejector member out of the bore at the force applying surface.

2. A carrier assembly according to claim 1 in which the ejector member is a spherical member.

3. A carrier assembly according to claim 1 in which the second spring member exerts a force in the range of approximately 30–50 grams on the ejector member.

4. A carrier assembly according to claim 1 in which the ejector member is movable to extend beyond the force surface a distance in the range of approximately 0.004–0.009 inch.

5. A carrier assembly according to claim 1 in which the lid has a post having a longitudinal axis extending upwardly, the post received in an opening formed in the latch, the bore in the lid extending through the post along the longitudinal axis, a portion of the bore in the post being threaded and a threaded member is received in bore, the second spring member extending between the threaded member and the ejector member.

6. A carrier assembly according to claim 1 in which the ejector member is an elongated pin having an outwardly extending retainer flange and the bore in the lid is formed with a stop surface which cooperates with the retainer flange to limit outward movement of the ejector member.

7. A carrier assembly according to claim 6 in which the retainer flange is centrally located along the elongated pin so that either end of the pin can be used to engage the die.

8. A carrier assembly for carrying a semiconductor device comprising:

a substrate assembly including a substrate, a plurality of contact bumps on a top surface of the substrate for contacting bond pads on a semiconductor device, the substrate also including a plurality of conductive pads electrically connected to the contact bumps, a back plate having opposite side ends and a top surface and a bottom surface, means for contacting a top surface of the semiconductor device to force the bond pads of the semiconductor device against the contact bumps including, a pair of posts extending from the substrate, each of the posts having a shaft having a first diameter and a head having a second diameter greater than the first diameter, a lid having a pair of openings through which the posts extend, a latch having a pair of openings, each of the openings in the latch having a first portion larger than the head of an associated one of the posts and a second portion smaller than the head of an associated one of the posts, the lid having a bore extending through the lid to a lower, force applying surface, the lid having a post having a longitudinal axis extending upwardly, the post received in an opening formed in the latch, the bore in the lid extending through the post along the longitudinal axis, a portion of the bore in the post being threaded and a threaded member is received in bore, a first spring position between said lid and said latch, an ejector member received in the bore having a portion movable beyond the bore on the force applying surface of the lid, and a second spring member extending between the threaded member and the ejector member placing a force on the ejector member in a direction to move the ejector member out of the bore at the force applying surface.

* * * * *